United States Patent [19]

Furuya

[11] Patent Number: 4,650,723
[45] Date of Patent: Mar. 17, 1987

[54] MATERIAL FOR ELECTRIC CONTACTS

[75] Inventor: Kiyoto Furuya, Yokohama, Japan

[73] Assignee: Daiichi Denshi Kogyo Kabushiki Kaisha, Tokyo, Japan

[21] Appl. No.: 748,996

[22] Filed: Jun. 26, 1985

[51] Int. Cl.⁴ .............................................. B21D 39/00
[52] U.S. Cl. .................................... 428/622; 428/624; 428/626
[58] Field of Search ............... 428/622, 624, 626, 929, 428/930, 458, 461

[56] References Cited

U.S. PATENT DOCUMENTS

| | | | |
|---|---|---|---|
| 3,565,752 | 2/1971 | Grossman | 428/461 |
| 3,578,552 | 5/1971 | Prevorsek et al. | 428/461 |
| 3,857,683 | 12/1974 | Castonguay | 428/626 |
| 4,424,254 | 1/1984 | Hedrick | 428/461 |
| 4,477,513 | 10/1984 | Koga | 428/461 |

FOREIGN PATENT DOCUMENTS 52-57989 5/1977 Japan .
53-20107 6/1978 Japan .
57-16472 4/1982 Japan .
58-117661 7/1983 Japan .

Primary Examiner—Christopher W. Brody
Attorney, Agent, or Firm—Silvermann, Cass, Singer & Winburn, Ltd.

[57] ABSTRACT

A material for forming contacts for use in connectors, switches and the like for electronic appliances. The material comprises a first metal layer having a conductivity, a second metal layer having a springiness and a plastic layer interposed between these metal layers. With this arrangement, the contacts according to the invention can be miniaturized to a far greater extent and far more inexpensively in comparison with prior art contacts made of copper alloys while maintaining the same current capacity and contact pressure. Moreover, the contacts according to the invention can eliminate disadvantages of prior art contacts made of two directly contacted metals, such as separation between them and elongation due to difference in coefficient of thermal expansion, deterioration of the contacts due to diffusion therebetween, and disintegration of the contacts due to electrochemical corrosion resulting from difference in electric potential between two metals.

12 Claims, 15 Drawing Figures

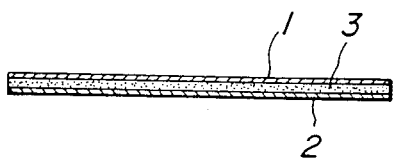
FIG_1
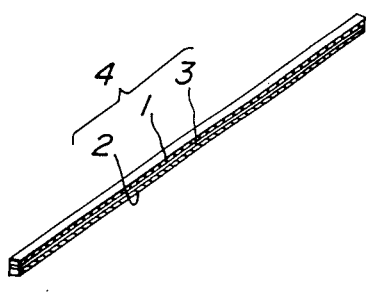
FIG_2a
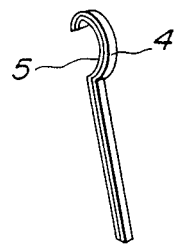
FIG_2b
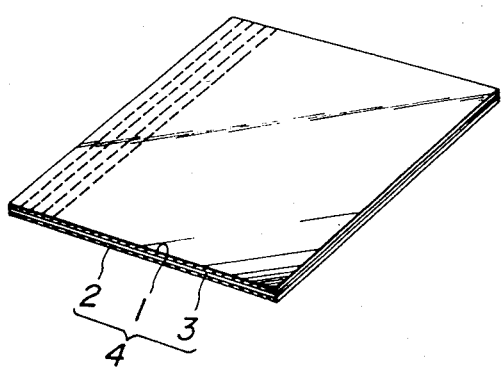
FIG_3
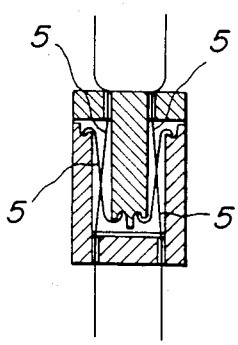
FIG_4

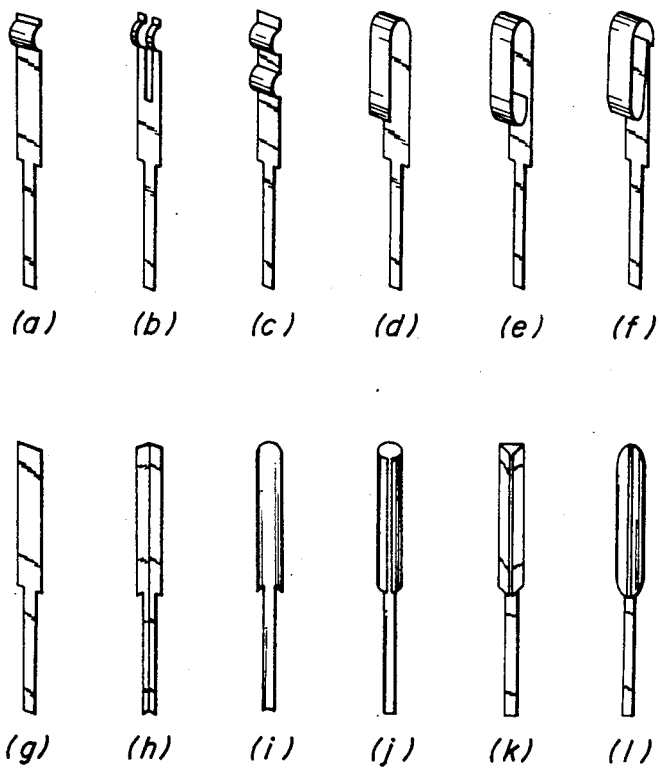

FIG_6a
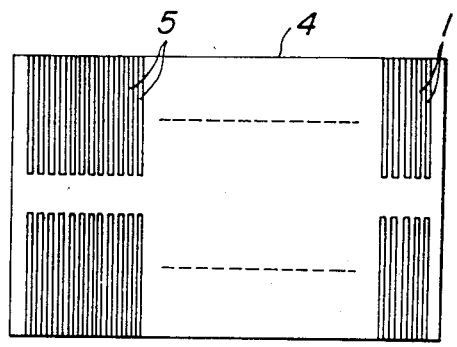
FIG_6b
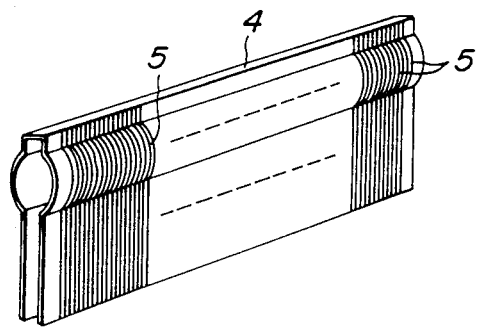
FIG_6c
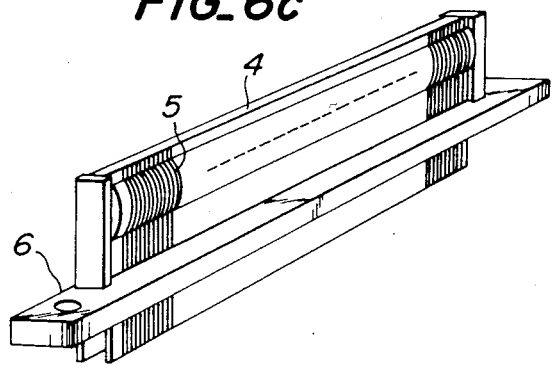

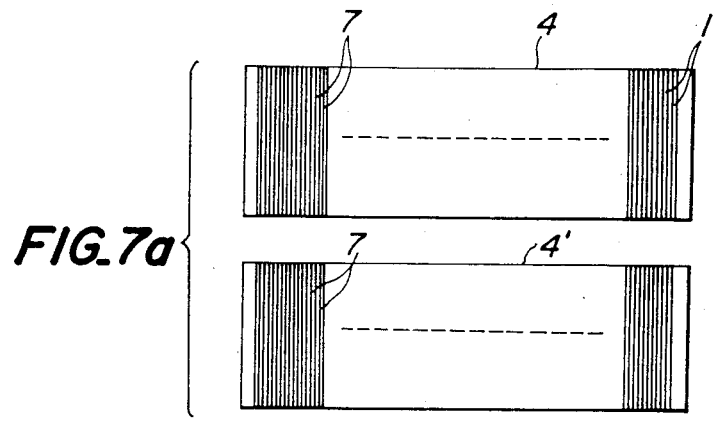
FIG_7a
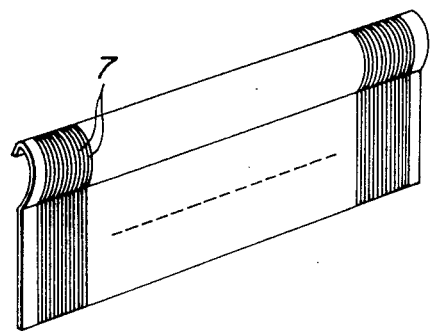
FIG_7b
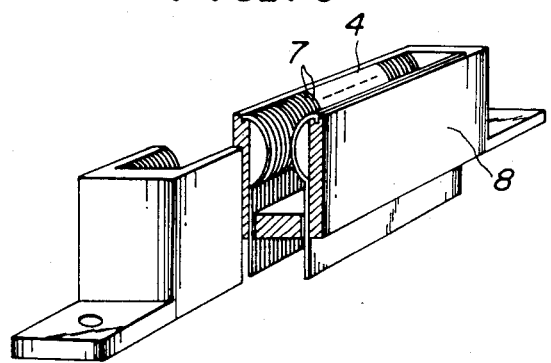
FIG_7c

MATERIAL FOR ELECTRIC CONTACTS

BACKGROUND OF THE INVENTION

1. Field of the Invention:

This invention relates to a material for forming electric contacts which are used in connectors, switches, relays or the like for electronic equipment and which are inexpensive and have high conductivity and springiness which could not be achieved by nowadays widely used copper alloys such as phosphor bronze.

2. Description of the Prior Art:

In these days, there is generally a tendency for articles or goods substantially in all fields to become lighter, thinner, shorter and smaller to fulfill the requirements in the present age in view of economy and saving of resources. Particularly in the field of electronic products, manufacturers endeavor to make small-sized and high-performance products. In order to fulfill the requirements, it is essential to realize the miniaturization of parts which include contacts such as connectors, switches and the like, a great number of which are used in the electronic equipment. Such miniaturization enables these parts to be utilized in electronic appliances in highly compact manner. However, it is almost impossible for the contacts made of prior art copper alloys to be miniaturized to any great extent.

More specifically, the contacts for use in connectors, switches and the like are required to be both highly conductive and springy. In general, however, metals having higher conductivity tend to exhibit lower springiness, while metals having higher springiness tend to exhibit lower conductivity. There has been no metal found which fulfills these two requirements, that is, the high conductivity and springiness simultaneously.

Therefore, as a least of evils, copper alloys such as phosphor bronze are generally used. They fulfill the above requirements to a certain extent, though not satisfactorily. However, even such a copper alloy, which is generally recognized to be most suitable for this purpose, has a much lower conductivity than that of pure copper and silver. In order to obtain contacts of high conductivity having the required springiness, therefore, sectional areas of the contacts have been made large to improve their conductivity, so that the contacts unavoidably become large. Accordingly, the miniaturization of contacts is severly limited. Moreover, copper alloys to be used as spring materials are generally not only very expensive but also very troublesome in production processes, inasmuch as they require high accuracy heat treatment by precisely controlling temperature, time and atmosphere for accurate and quality manufacture. Contacts made of such alloys are naturally expensive.

In order to eliminate the above disadvantages, it has been attempted to join, or laminate, a very springy metal and a highly conductive metal by pressure welding, electrolytic process or vapor deposition to obtain contacts having high conductivity and springiness. However, the contacts thus obtained have the following disadvantages which have precluded their adoption for practical use. For example, with this method of directly joining the different metals, diffusion between them progresses over time to change compositions and conditions of the metals, so that the initial characteristics of the metals degrade. When a stainless steel is used as a spring material and is coated with silver, copper or gold for high conductivity, oxide films on the stainless steel for preventing its rust should be removed in order to ensure the proper coating of the conductive metal. Therefore, the superior corrosion-resistance of the stainless steel is lost and serious corrosion occurs when pin-holes, cracks or the like occur in the coating metal. Furthermore, the electrical potential of the stainless steel is quite different from that of the copper, silver or gold, so that there is a risk of electrochemically promoting the corrosion of the stainless.

Another disadvantage with this type of joined or laminated body is that the composite body sometimes tends to separate or break due to thermal stresses resulting from the difference in coefficient of thermal expansion of each of the materials.

It is therefore impossible for the contacts of the prior art to realize the necessary miniaturization and low cost while improving the performance. Moreover, it is almost impossible to realize the miniaturization and low cost of electronic appliances by very compactly arranging therein the prior art connectors or the like.

SUMMARY OF THE INVENTION

It is a principal object of the invention to provide an improved electrical contact-forming material which eliminates the disadvantages of the prior art.

In order to achieve this object, the electric contact forming material according to the invention comprises a first metal layer for providing conductivity, a second metal layer for providing springiness and a plastic layer interposed between the first and second metal layers to form a laminated material.

In a preferred embodiment, the plastic layer has insulating characteristics or conductivity.

In another embodiment, at least one of the first or second metal layers consists of at least two sublayers, between which a plastic layer is interposed.

Either one of the first or second metal layers consists of two metal sublayers which are arranged on one side of the other of the metal layers or arranged one on each side of the other metal layer.

In a further embodiment, at least one of the first and second metal layers is at least partially provided with a coating layer by metal plating, chemical treatment or coating with an oil, a paint or a coating agent in order to improve environment-resistance, wear-resistance, stability of electric connection, weldability, solderability or the like.

The invention will be more fully understood by referring to the following detailed specification and claims taken in connection with the appended drawings.

BRIEF DESCRIPTION OF THE DRAWINGS

FIG. 1 is a sectional view illustrating the principal constitution of the contact forming material according to the invention;

FIG. 2a is a perspective view of one strip cut from the contact forming material according to the invention;

FIG. 2b is a perspective view of the strip shown in FIG. 2a, which has been formed into a contact;

FIG. 3 is a perspective view of a contact forming material according to the invention;

FIG. 4 is a sectional view of a connector using contacts made from the material shown in FIG. 3;

FIG. 5 illustrates various shapes of contacts (a)–(l) formed from the material shown in FIG. 3;

FIG. 6a illustrates a contact forming material according to the invention, formed with a number of first metal layers by etching;

FIG. 6b is a perspective view illustrating the contact forming material shown in FIG. 6a, which has been folded;

FIG. 6c is a perspective view of a male connector including the folded material shown in FIG. 6a;

FIG. 7a illustrates two contact forming materials for forming a female connector;

FIG. 7b is a perspective view illustrating the material shown in FIG. 7a which is formed so as to include an extending contacting portion;

FIG. 7c is a perspective view illustrating male and female connectors made from the materials shown in FIGS. 6a and 7a;

DETAILED DESCRIPTION OF THE PREFERRED EMBODIMENT

Figure 8:
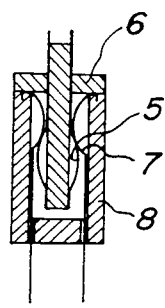
FIG. 8 is a sectional view of the connector consisting of the male and female connectors shown in FIGS. 6c and 7.

FIG. 1 illustrates in section one embodiment of a material for forming a contact according to the invention. This material essentially comprises a first metal layer 1 having a desired conductivity and a second metal layer 2 having a required springiness selected from the existing metals and a plastic layer 3 interposed therebetween for supporting the two laminated metal layers 1 and 2 one above the other. This composite material is produced in the following manner.

One metal having a required conductivity for forming the first metal layer 1 is selected from a group of the existing metals such as copper, silver, gold, aluminum and the like and alloys of these metals. Then, one metal having a required spring force for forming the second metal layer 2 is selected from a group of the existing metals such as iron alloys, for example spring stainless steel, copper alloys, for example spring beryllium-copper alloy, a metal containing spring reinforcing agent, for example whisker and the like, amorphous metal and the like. These metals are formed in plates, strips or foils according to required current capacity, spring force, shapes of the contact to be made, manufacturing method and the like. Between the thus formed layers 1 and 2 is attached a plate or sheet like plastic material 3, having a required thickness and coated with thermoplastic or heat bonding adhesive, by heating and pressure welding or with the aid of a rubber adhesive or polymerization setting adhesive. The plastic material may be, for example, epoxy, polyester, polyimide, polyamide or polyolefin resin. As an alternative, the first and second metal layers 1 and 2 may be formed on the plastic layer 3 by means of electroplating, chemicalplating, vapor deposition or sputtering.

In this manner, the present invention achieves a very significant advance over the prior art which had attempted to do the inherently impossible, that is, to make a single body fulfill both the conductivity and springiness requirements. According to the invention, there are provided the first metal layer 1 taking charge of the conductivity and the second metal layer 2 taking charge of the springiness to effectively utilize the respective characteristics without compromising both the conductivity and springiness. Accordingly, for example, a contact forming material 4 in a strip shape produced according to the invention, as shown in FIG. 2a, is cut and formed into a contact 5 as shown in FIG. 2b which is small-sized and inexpensive in comparison with those of the prior art made of the copper alloys under the same current capacity and contact pressure. The contacts 5 are used for a connector as shown in FIG. 4. Moreover, for example, a contact forming material 4 in a plate shape as shown in FIG. 3 produced according to the invention may be cut and formed or punched into various shapes of contacts as shown in FIGS. 5(a)–(l).

Moreover, according to the invention, the plastic layer 3 is securely held by means of advanced adhesion technique between the first and second metal layers 1 and 2. The required insulating or conductive property and desired pliability or flexibility can be easily imparted during manufacture to plastic layer 3 according to use conditions, thereby eliminating the disadvantages inherent in utilizing two directly contacted metals as discussed above with respect to the prior art. More specifically, according to the invention, there is no risk of damage to the contacts due to separation of metals because the pliability of the plastic material absorbs the strains due to difference in coefficient of thermal expansion of the two metals and due to difference in elongation caused by bending in forming and using the contacts.

Moreover, the interposed plastic layer 3 prevents the change in composition of the metal layers due to diffusion over time which would occur in two directly contacted or joined metals such as in the prior art, thereby preventing the deterioration on the contacts. Furthermore, if a plastic layer 3 having insulating properties is used, the two metal layers 1 and 2 are electrically insulated from each other to prevent a local cell or battery caused by the difference in electric potential between the two metals, thereby preventing disintegration due to electrochemical corrosion. In this manner, all the disadvantages of the prior art stemming from the utilization of two directly contacted or joined metals are completely eliminated.

The following significant advantages for manufacturing connectors can be accomplished by the contacts comprising the interposed plastic layers 3 according to the invention. For example, as shown in FIG. 6a, first metal layers 1 of a contact forming material 4 in a plate shape according to the invention is etched or treated by any other method to form a half-finished product including groups of contacts 5 of desired size and number with desired intervals. This obtained product is folded substantially along its center line and formed so as to have contacting portions extending outwardly as shown in FIG. 6b. This formed product is fixed to an insulator body 6 as shown in FIG. 6c.

Alternatively, two samples of contact forming materials, labelled 4 and 4' in FIG. 7a, are formed so as to have contacting portions including groups of contacts 7 extending outwardly as shown in FIG. 7b. These materials 4 and 4' are then fixed to an insulator body 8 as shown in FIG. 8. In this manner, a multi-contact connector is obtained which comprises groups of contacts 5 and 7 as male and female contacts, respectively.

Therefore, the invention provides a contact group comprising a great number of contacts not deformable, fine and inexpensive and arranged at high density and with high accuracy in an inexpensive manner, which could not be accomplished by contacts of the prior art made by pressing expensive beryllium-copper alloy or the like. By fixing the contact groups onto insulating blocks, connectors having less number of parts can be simply produced.

According to the invention, therefore, small-sized multi-contact connectors can be produced with low cost, inasmuch as it is not required to take account of deformations of contacts and manufacturing accuracy or tolerance of distance between apertures for mounting, which are required in the prior art where a great number of contacts are formed by pressing and then must be inserted and fixed into corresponding apertures formed in insulating blocks.

Figure 9A:
FIG. 9a is a sectional view illustrating a further embodiment of the material according to the invention including one metal layer consisting of two metal sublayers which are arranged on one side of the other metal layer.
Figure 9B:
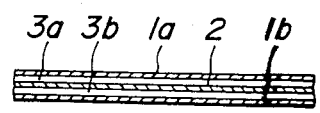
FIG. 9b is a sectional view illustrating a still further embodiment of the material according to the invention including one metal layer consisting of two metal sublayers which are arranged one on each side of the other metal layer.

Although the invention has been shown with the first and second metal layers and the plastic layer, this is only by way of example, and any materials, shapes, thicknesses and laminated numbers could be provided as necessary so long as the contact forming material comprises a conductive material, a spring material and a plastic material. For example, it may comprise a first high conductive metal layer 1, two metal sublayers 2a and 2b having a high springiness, and two plastic sublayers 3a and 3b interposed therebetween as shown in FIG. 9a. As shown in FIG. 9b, alternatively, a metal layer 1 having the required conductivity may be formed of two metal sublayers 1a and 1b, and between these metal sublayers is interposed a spring metal layer 2. Between sublayer 1a and metal layer 2, and between sublayer 1b and metal layer 2 may be inserted plastic layers 3a and 3b respectively, each having an insulating property or a conductivity to form laminated contact. In this manner, various changes can be made without departing from the scope of the invention.

Moreover, without providing an independent plastic layer, for example, a copper foil and a stainless steel foil may be joined by a heat-welding plastic adhesive which serves as the plastic layer 3. As an alternative, a stainless steel foil is coated on its one surface with a plastic material which is in turn provided on its surface with a metal such as copper, silver or the like by vapor deposition, ion plating or the like. In order to improve environment-resistance, wear-resistance, stability of electric connection, weldability, solderability or the like, the first and/or second metal layer or its sublayers may be provided with a layer (not shown) by metal plating, chemical treatment such as oxidizing or coating with an oil, a paint or a coating agent.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A miniature electric contact forming material comprising:

(a) a flexible plastic layer, said plastic being selected from the group consisting of epoxy, polyester, polyimide, polyamide, and polyolefin resins;
   (b) a first metal layer bonded to a first face of said plastic layer, said first metal layer being of a type having high electrical conductivity; and
   (c) a second metal layer bonded to the opposite face of said plastic layer, said second metal layer being of a type having substantial spring force;
   wherein said first and second metal layers are different from each other and are not in direct contact with each other, or with any other metal layer of the other type,
   and wherein said material possesses high conductivity provided by said first metal layer, and springiness, provided by said second metal layer.

2. An electric contact forming material as set forth in claim 1, wherein said plastic layer is electrically insulating.

3. An electric contact forming material as set forth in claim 1, wherein said plastic layer is electrically conductive.

4. An electric contact forming material as set forth in claim 1, wherein at least one of said first and second metal layers consists of at least two sublayers, between which a plastic layer is interposed.

5. An electric contact forming material as set forth in claim 1, wherein either one of said first and second metal layers consists of two metal sublayers which are arranged on one side of the other of said first and second metal layers, between which two metal sublayers is interposed a plastic layer.

6. An electric contact forming material as set forth in claim 1, wherein either one of said first and second metal layers consists of two metal sublayers which are arranged one on each side of the other of said first and second metal layers.

7. A miniature electric contract forming material as set forth in claim 1, wherein said plastic layer is formed by a plastic adhesive.

8. A miniature electric contact forming material as set forth in claim 1, wherein said plastic layer is bonded to at least one of said first and second metal layers by means of an adhesive.

9. A miniature electric contact forming material as set forth in claim 8, wherein said adhesive is selected from the group consisting of thermoplastic adhesives, heat bonding adhesives, rubber adhesives, and polymerization setting adhesives.

10. A miniature electric contact forming material as set forth in claim 1, wherein said contact is formed by coating said second metal layer on said plastic layer, and providing said first metal layer on said plastic layer by electroplating, chemical plating, vapor deposition or sputtering.

11. A miniature electric contact forming material as set forth in claim 1, wherein said first metal layer is selected from the group consisting of copper, gold, aluminum, silver and alloys thereof.

12. A miniature electric contact forming material as set forth in claim 1, wherein said second metal layer is an iron alloy, a copper alloy, an amorphous metal, or a metal containing a spring reinforcing agent.

* * * * *